(12) United States Patent
Fujiwara et al.

(10) Patent No.: US 11,183,234 B2
(45) Date of Patent: Nov. 23, 2021

(54) BITCELL SUPPORTING BIT-WRITE-MASK FUNCTION

(71) Applicant: Taiwan Semiconductor Manufacturing Company, Ltd., Hsinchu (TW)

(72) Inventors: Hidehiro Fujiwara, Hsinchu (TW); Yen-Huei Chen, Hsinchu (TW); Yi-Hsin Nien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/693,677

(22) Filed: Nov. 25, 2019

(65) Prior Publication Data
US 2021/0158864 A1 May 27, 2021

(51) Int. Cl.
*G11C 11/00* (2006.01)
*G11C 11/419* (2006.01)
*H01L 27/11* (2006.01)
*G11C 11/412* (2006.01)

(52) U.S. Cl.
CPC .......... *G11C 11/419* (2013.01); *G11C 11/412* (2013.01); *H01L 27/1104* (2013.01)

(58) Field of Classification Search
CPC ........ G11C 8/10; G11C 11/419; G11C 11/412
See application file for complete search history.

(56) References Cited

U.S. PATENT DOCUMENTS

| | | | |
|---|---|---|---|
| 6,005,794 A | 12/1999 | Sheffield et al. | |
| 6,262,936 B1 * | 7/2001 | Arcoleo | G11C 8/16 365/189.04 |
| 6,538,954 B2 | 3/2003 | Kunikiyo | |
| 7,161,868 B2 | 1/2007 | Morishima | |

(Continued)

FOREIGN PATENT DOCUMENTS

| | | |
|---|---|---|
| DE | 10 2006 000 516 T5 | 1/2008 |
| TW | M386579 U | 8/2010 |

(Continued)

OTHER PUBLICATIONS

Sinangil et al., "A 290mV Ultra-Low Voltage One-Port SRAM Compiler Design Using a 12T Write Contention and Read Upset Free bit-Cell in 7nm FinFET Technology", 2018 Symposium on VLSI Circuitd Digest of Technical Papers, 2 pages, dated 2018.

*Primary Examiner* — Tuan T Nguyen
(74) *Attorney, Agent, or Firm* — Merchant & Gould P.C.

(57) ABSTRACT

An SRAM includes multiple memory cells, each memory cell includes a data storage unit; a data I/O control adapted to input data to, and output data from, a data line (BL); and multiple access controls respectively connected to at least two access control lines (WL's) and adapted to enable and disable the data input and output from the at least two WL's (WX and WY). The access controls are configured to permit data input only when both WL's are in their respective states that permit data input. A method of writing to a group of SRAM cells include sending a first write-enable signal to the cells via a first WL, sending a group of respective second write-enable signals to the respective cells, and, for each of the cells, preventing writing data to the cell if either of the first write-enable signal and respective second write enable signal is in a disable-state.

20 Claims, 10 Drawing Sheets

(56) References Cited

U.S. PATENT DOCUMENTS

| | | | |
|---|---|---|---|
| 8,451,652 B2 | 5/2013 | Seikh et al. | |
| 8,837,206 B2 * | 9/2014 | Glorieux | G11C 19/28 365/154 |
| 2004/0079978 A1 * | 4/2004 | Kang | G11C 11/412 257/300 |
| 2005/0213415 A1 * | 9/2005 | Matsuzawa | G11C 8/08 365/227 |
| 2012/0155151 A1 * | 6/2012 | Rachamadugu | G11C 11/412 365/154 |
| 2016/0254045 A1 | 9/2016 | Mazumder et al. | |
| 2018/0158520 A1 | 6/2018 | Shu et al. | |
| 2019/0096476 A1 | 3/2019 | Chen et al. | |

FOREIGN PATENT DOCUMENTS

| | | |
|---|---|---|
| TW | I470640 B | 1/2015 |
| WO | 2006/096265 A2 | 9/2006 |

\* cited by examiner

US 11,183,234 B2

BITCELL SUPPORTING BIT-WRITE-MASK FUNCTION

BACKGROUND

This disclosure relates generally to semiconductor memory cells, such as static random access memory ("SRAM") cells and arrays of such cells. Semiconductor memory is an electronic data storage device implemented on a semiconductor-based integrated circuit. Semiconductor memory is made in many different types and technologies. Semiconductor memory has much faster access times than many other types of data storage technologies. For example, a byte of data can often be written to or read from semiconductor memory within a few nanoseconds, while access times for rotating storage such as hard disks is in the range of milliseconds. For these reasons, among others, semiconductor memory is used as a primary storage for computer memory to hold data the computer is processing, among other uses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
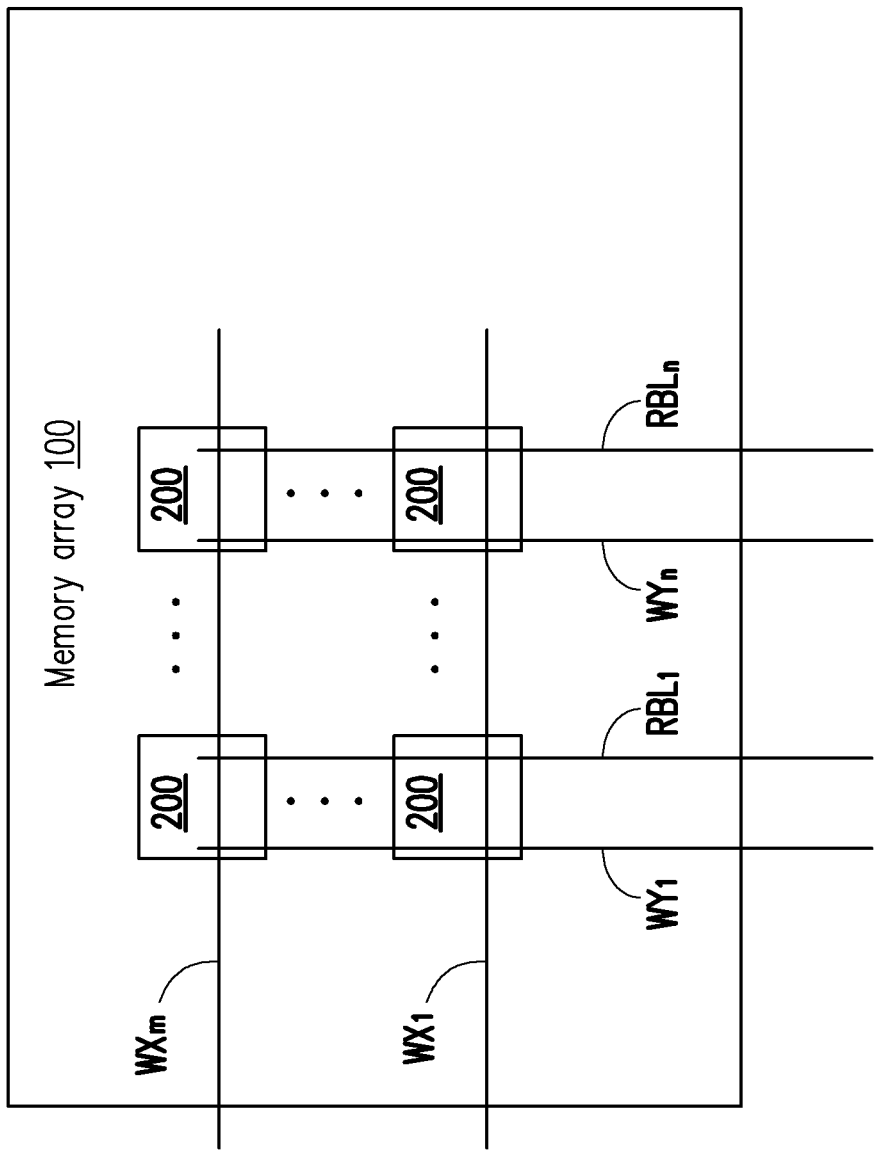
FIG. 1 shows a schematic diagram of a memory array, with associated access lines, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A static random access memory (SRAM) device has an array of memory cells, each of which constitutes one bit of memory and includes a number transistors. In some examples, each SRAM cell can include a data storage, such as a pair of inverters, such as complementary metal-oxide-semiconductor (CMOS) inverters connected in a feedback loop, i.e., the output of each inverter being connected to the input of the other inverter. The memory cell can thus have two inputs/outputs that are one's complements of each other. An SRAM cell can further include access transistors for switching on-and-off connections to the inputs/outputs from the data lines (bit lines (BL's)), thereby enabling and disabling input and output (I/O) to and from the cell. The access transistors can be turned on or off by signals from access control lines (word lines (WL's)) connected to the control terminals, such as gates of field-effect transistors (FET's, or more specifically, metal-oxide-semiconductor FET's (MOSFET's)).

In some examples, the transistors are formed using a fin field effect transistor (FinFET) architecture. For example, a polysilicon structure can be connected to a semiconductor fin that extends above an isolation material. The polysilicon structure functions as the gate of the FinFET transistor such that a voltage applied to the polysilicon structure determines the flow of electrons between source/drain (S/D) contacts connected to the fin on opposite sides of the polysilicon structure. A threshold voltage of the FinFET transistor is the minimum voltage such that the transistor is considered to be turned "on" such that an appreciable current can flow between the S/D contacts. The number of polysilicon structures in contact with a fin along its length that are used in forming a SRAM cell can be considered to be the "pitch," often termed the "contacted poly pitch" or CPP, of the SRAM cell along one dimension. CPP is at least partially determinative of the density of the SRAM device.

According to certain aspects of the present disclosure, an SRAM device includes multiple memory cells, which can be arranged in rows and columns, structurally and/or logically. Each memory cell includes a data storage; a data I/O control adapted to input data to, and output data from, the data storage via a data line (BL); and multiple access control respectively connected to at least two access control lines (WL's) and adapted to enable and disable the data input and output from the at least two WL's (WX and WY). The access control in some embodiments is configured to permit data input only when both WL's are in their respective states that permit data input. The data storage includes two CMOS inverters connected in a feedback loop in some embodiments. The data I/O control in some embodiments includes a read-access transistor connecting an output of the CMOS inverter pair to an output line (read bit line (RBL)). The access control inputs in some embodiments include a first write-access transistor having a control input connected to the first access control line (WX), and a second write-access transistor having a control input connected to the second access control line (WY), the first and second write-access transistor adapted to cooperatively permit data input to the data storage. In some embodiments, the first and second write-access transistors are connected in series with an input of the data storage, thereby connecting the input to a voltage source (high or low) only when both the first and second write-access transistors are "on." In some embodiments, at least one of the write-access control lines is configured as both a write-access control line and a data input line (write bit line (WBL)). For example, in some embodiments, the second write-access control line (WY) includes multiple (e.g., two) digital control lines, and the bit pattern of the control lines of WY enables and disables the write operation as well as provides the value written to the cell.

As shown in FIG. 1, in one embodiment according to the present disclosure, and SRAM device includes a memory array (100) of m×n memory cells (200) arranged in m rows and n-columns. A first set of m write-access control lines, or row write-access control lines, $WX_1—WX_m$, are connected to each of the n memory cells (200) in the respective rows; a second set of n write-access control lines, or column write-access control lines, $WY_1-WY_n$, are connected to each of the m memory cells (200) in the respective columns. In addition, a set of n read bit lines $RBL_1-RBL_n$ are connected to each of the m memory cells (200) in the respective columns.

Figure 2:
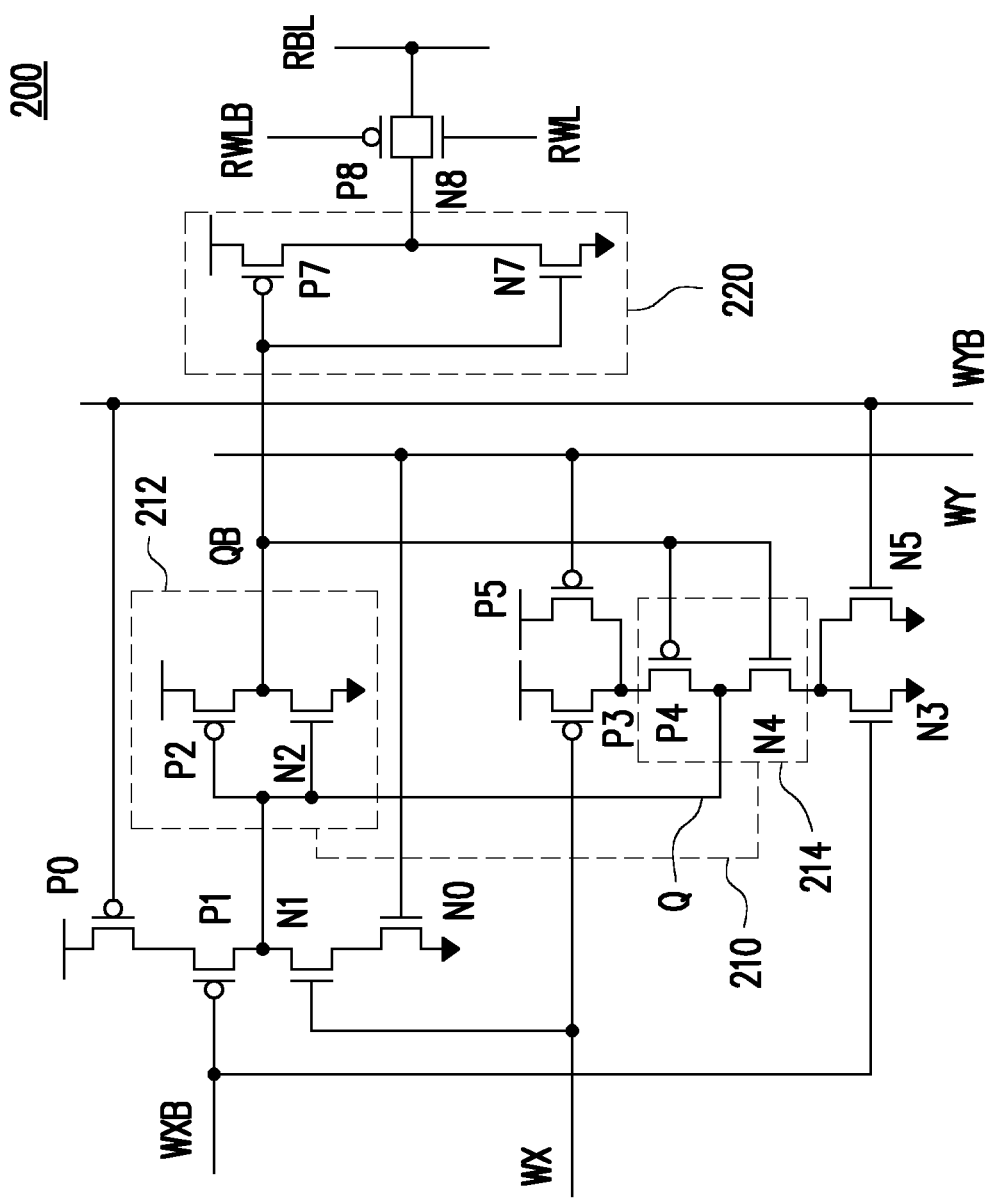
FIG. 2 shows a schematic diagram of a static random access memory ("SRAM") cell according to some embodiments.

As shown in more detail in FIG. 2, each memory cell (200) in some embodiments includes a data storage (210), which include a pair of CMOS inverters (212, 214). Inverter (212) includes a p-type MOS (PMOS) transistor P2 and n-type MOS (NMOS) transistor N2 connected in series, with the drain of P2 and the source of N2 connected to each other, forming an output QB of the data storage (210). The source of P2 is connected to the high end of a voltage supply (such as Vss); the drain of N2 is connected to the low end (such ground) of the voltage supply. The gates of P2 and N2 are connected to each other, forming an input Q of the data storage (210), where Q and QB are inversions, or one's complements, of each other. Similarly, inverter (214) includes a PMOS transistor P4 and NMOS transistor N4 connected in series, with the drain of P4 and the source of N4 connected to each other and to the input Q, and the gates of P4 and N4 connected to each other and to the output QB.

The memory cell (200) in some embodiments further includes a first set of write-access transistors, including an NMOS transistor N1, PMOS transistor P3, PMOS transistor P1 and NMOS transistor N3. The gates of N1 and P3 are connected to each other and to the row write-access control line WX (one of lines $WX_1—WX_m$). The gates of P1 and N3 are connected to each other and to the inversion, WXB (WX-Bar) of row write-access control line WX. The memory cell (200) in some embodiments further includes a second set of write-access transistors, including an NMOS transistor N0, PMOS transistor P5, PMOS transistor P0 and NMOS transistor N5. The gates of N0 and P5 are connected to each other and to the column write-access control line WY (one of lines $WY_1-WY_n$). The gates of P0 and N5 are connected to each other and to the inversion, WYB (WY-Bar) of column write-access control line WY. Transistors P0, P1, N1 and N0 are connected in series between the high end of the voltage supply (e.g., $V_{DD}$) and the low end (e.g., ground) of the voltage supply, with the junction between P1 and N1 connected to the input Q. Transistors P3 and P5 are connected in parallel, with their sources connected to the high end of the voltage supply, and drains connected to the source of P4; transistors N3 and N5 are connected in parallel, with their sources connected to the drain of N4, and drains connected to the low end of the voltage supply.

The memory cell (200) in some embodiments further includes a pair of read-access transistors, i.e., PMOS P8 and NMOS N8, connected in parallel with each other. The gate of N8 is connected to a read-access control line (read word line (RWL)), and the gate of P8 is connected to the inversion of RWL (RWLB (RWL Bar)). The drains of P8 and N8 are connected to the bit line RBL (one of the lines $RBL_1-RBL_n$). The output QB in some embodiments is connected to a CMOS inverter (220), which includes a PMOS P7 and NMOS N7). The sources of P8 and N8 are connected to the output of the inverter (220).

There are thus sixteen (16) transistors that make up each memory cell (200) shown in FIG. 2.

In operation, in a WRITE operation, in which data are transmitted from a data source to the memory cells (200), if the row word line WX is not selected (in this case low, or "0", and WXB="1"), input to the data storage (210) is disabled regardless of the state of WY and WYB, except for WY="1" and WYB="0." There is thus no writing of data to the cell if WX is de-selected and the state of WY="1" and WYB="0" is prohibited. If the row word line WX is selected (i.e., WX="1", and WXB="0"), then the writing of data to the cell depends on the state of WY and WYB (again, except the prohibited state of WY="1" and WYB="0," in which case a short circuit of the voltage supply would result because P0, P1, N1 and N0 would all be conducting). If WY is de-selected, i.e., WY="0", and WYB="1," then the state of QB (and of Q) remains unchanged; the cell is thus masked from a WRITE operation. That is, when data bits are sent to a row that is write-enabled by WX, those cells in the row that have their respective WY de-selected will not undergo any change of state in QB. Because updating a cell state (QB) involves read-modify-write operations, for which cycle time is required, the elimination of unnecessary updating of the output of memory cells reduces the time penalty that would otherwise result from such operations.

If WY and WYB are both "1," then N0, N1 and N5 conduct, and P0, P1 and P5 are open. As a result, Q becomes "0," and QB becomes "1" regardless of the initial state of Q and QB; a "1" is written to QB. Similarly, if WY and WYB are both "0," then P0, P1 and P5 conduct, and N0, N1 and N5 are open. As a result, Q becomes "1," and QB becomes "0" regardless of the initial state of Q and QB; a "0" is written to QB.

The column write-access control lines WY and WYB thus serves dual functions of enabling and disabling writing to a cell and data lines for supplying the data to be stored in the memory cell.

The operation described above of the memory cell (200) is summarized in the table below:

TABLE 1

Truth Table For Memory Cell (200)

| Row | Column (Y&BWE) | WX | WXB | WY | WYB | QB |
|---|---|---|---|---|---|---|
| Unselected | Don't-care | 0 | 1 | X (prohibit 10) | | No write |
| | Unselected | 1 | 0 | 0 | 1 | No write |
| | Selected (L write) | Selected | 0 | 1 | 1 | 1 write |
| | Selected (H write) | 1 | 0 | 0 | 0 | 0 write |

In a READ operation of the cell (200), when the read-access line is selected (RWL="1" and RWLB="0"), the inversion of QB is passed to the read bit line (RBL). A data output from the memory cell (200) is thus accomplished.

Thus, an SRAM memory array (200) made up of sixteen-transistor (16-T) SRAM cells that support column select and bit write mask function is achieved.

Figure 3:
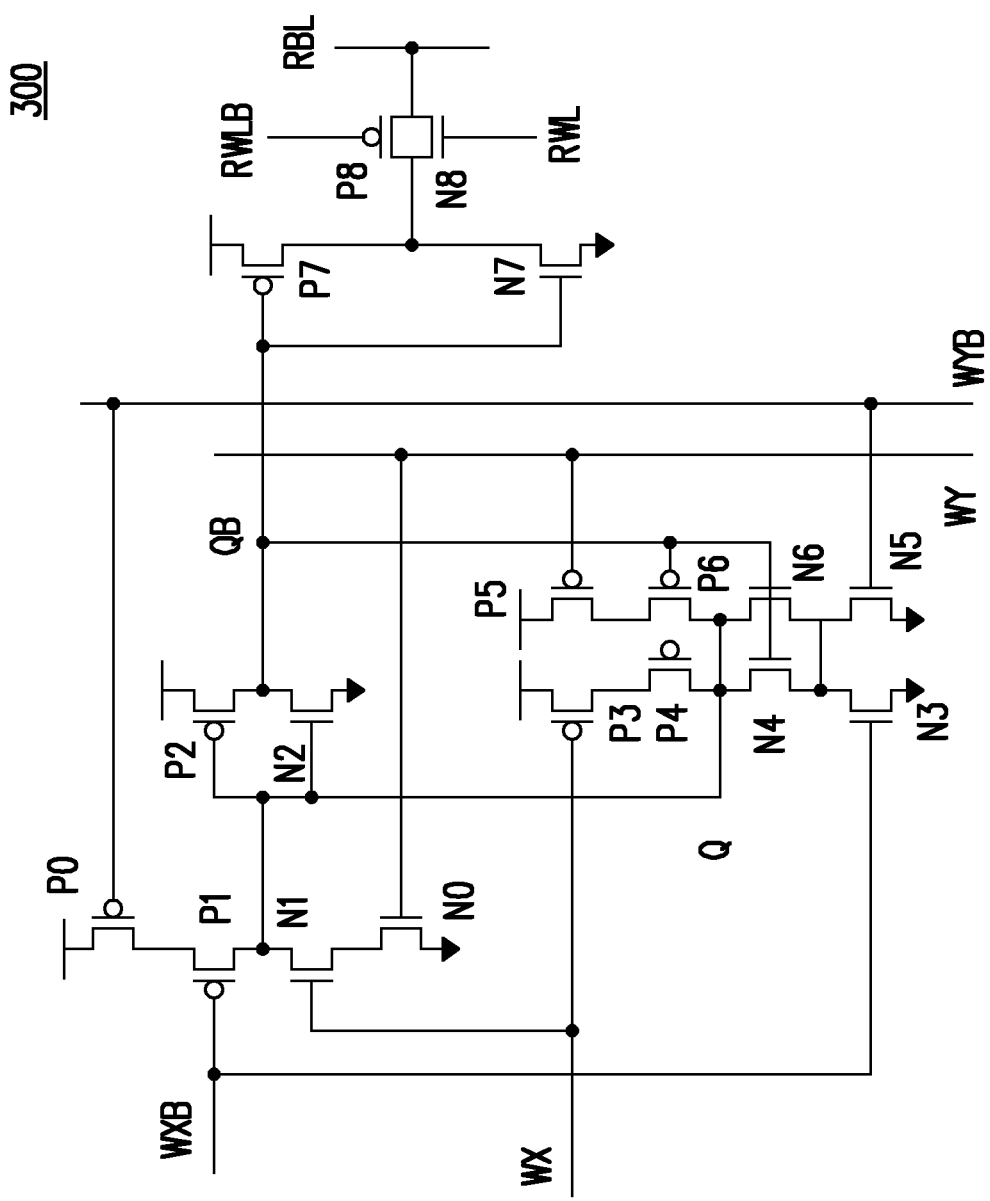
FIG. 3 shows a schematic diagram of another SRAM cell according to some embodiments.

In some embodiments, as shown in FIG. 3, transistors can be added to those shown in FIG. 2 to form a memory cell. Here, memory cell (300) includes those transistors (P0-P5, P7, P8, N0-N5, N7 and N8) that form the memory cell (200) in FIG. 2. Additionally, memory cell (300) includes a PMOS P6 connected in parallel with P4 and an NMOS N6 connected in parallel with N4. Because, as compared to the 16-T structure shown in FIG. 2, the gates of the redundant transistors P6 and N6 provides additional contact areas for QB and Q, the current loads at QB and Q are lessened as a result.

Figure 4:
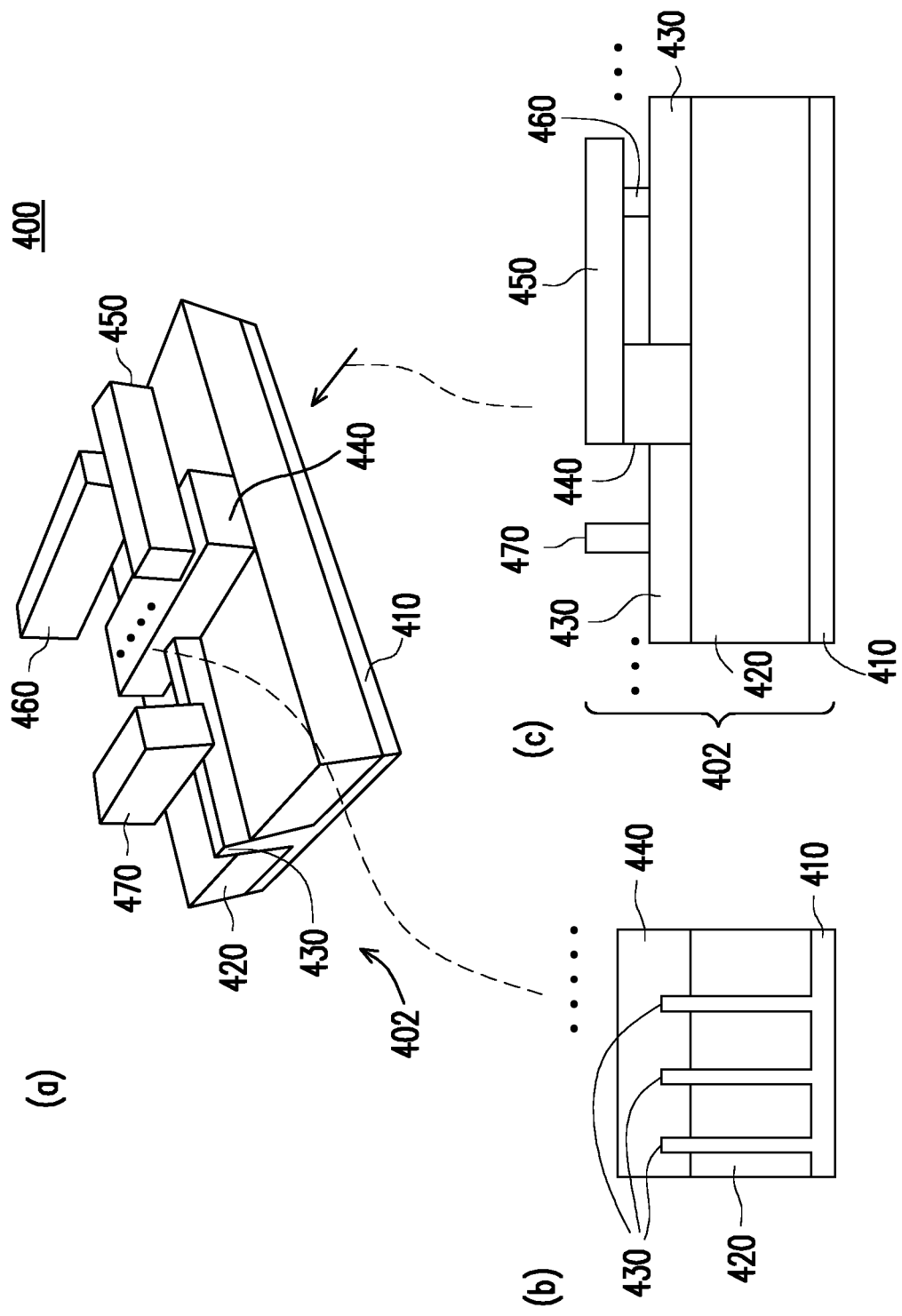
FIG. 4 illustrates an exemplary structure of a transistor that can be used in an SRAM cell according to some embodiments, with FIG. 4(a) showing a perspective view of the transistor, FIG. 4(b) showing a vertical cross-section along the poly-silicon ("poly") line, and FIG. 4(c) showing a side view along the poly line.

The circuits shown in FIGS. 2 and 3 can be implemented in some embodiments by MOSFETs in the form of a FinFET structure. As shown in FIG. 4, in some embodiments, a transistor (400 in FIG. 4(a)) in the FinFET structure includes a structure sometimes referred to as the "front end of line," or "FEOL," which includes a substrate (410), an isolation layer (420) covering the substrate (410), a semiconductor structure (430) in the form of a fin, which is supported (or grown) on the substrate and protruding above the isolation layer (420). A polysilicon ("poly") structure (440), in some embodiments in the form of a polysilicon line, is formed on top of the isolation layer (420) and surrounds the portion of the fin (430) protruding above the isolation layer (420) on multiple sides (top and two side surfaces). The polysilicon structure (440) serves as the gate of the transistor. A conductive gate contact (450) is formed on top of the polysilicon structure (440). A conductive source contact (460)) and a conductive drain contact (470) are formed in contact with the fin (430).

As shown in FIG. 4(b), which is a cross-sectional view through the polysilicon line and perpendicular to the substrate (410) and fin (430), in some embodiments, multiple fins (430) can be formed in an array. Furthermore, as shown in FIG. 4(c), which is an elevational view along the polysilicon line and parallel to the fins (430), in some embodiments, multiple transistors (400) can be formed along a common fin (430). Thus, an SRAM device can be formed in a two-dimensional array, with multiple fins in parallel and multiple cells (200, 300) formed by transistors along each fin (or set of fins).

Figure 5:
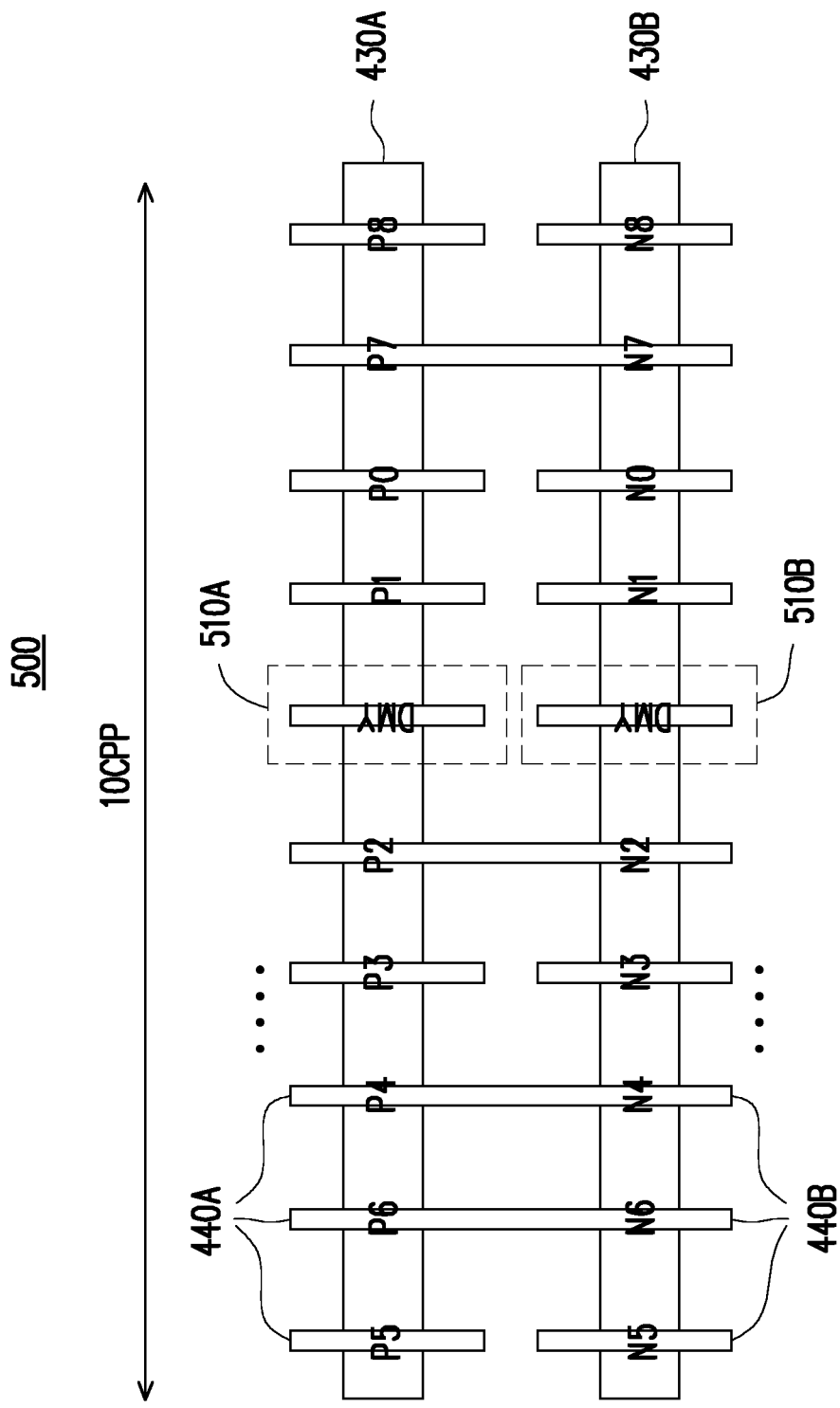
FIG. 5 shows a schematic physical layout of the SRAM cell of FIG. 2 according to some embodiments.

As an example, shown in FIG. 5, the SRAM memory cell (300) in FIG. 3 can be implemented by a twenty-transistor (20-T) cell structure (500), in which the PMOS's P0-P8 are formed along a common p-type fin (430A), and the NMOS's N0-N8 are formed along a common n-type fin (430B). (In FIG. 5, the polysilicon lines (440A) and (440B) are shown; the contacts are omitted.) In some embodiments, the PMOS's P0-P8 are spaced apart in substantially equal distance; likewise the NMOS's N0-N8 are spaced apart in substantially equal distance. In other embodiments, the PMOS's P0-P8 are spaced apart in unequal distances, and the NMOS's N0-N8 are spaced apart in unequal distances. For example, in some embodiments, it is desirable to have a greater separation between the group of transistors that serve the function of enabling and disabling data I/O and the group that serve the function of maintaining data in the cell than the separation between the transistors in each group. Thus, as shown in FIG. 5, the transistors in the group of P2, P3, P4, P6, and P5 are spaced apart by substantially equal distance, as are those in the group of P1, P0, P7, and P8, while the spacing between the two groups is greater. In one example, the inter-group spacing (i.e., between P1 and P2) is about twice the intra-group spacing (i.e., between neighboring transistors within each group). A similar configuration of the NMOS's can be made, as shown in FIG. 5.

In some embodiments, as further shown in FIG. 5, a dummy transistor can be disposed between groups of transistors within each cell (200, 300). In the example shown, a dummy transistor (510A) is disposed between PMOS's P1 and P2; a dummy transistor (510B) is disposed between NMOS's N1 and N2. The insertion of the dummy transistors provides both the increased separation between groups of transistors, as discussed above, and added area (e.g., polysilicon area) for making connections, thereby reducing density of loading.

The physical device (500) shown in FIG. 5 is thus a 20-T implementation of an SRAM memory cell having a 10CPP structure, i.e., having ten polysilicon structures (one for each gate for a PMOS or NMOS) in contact with a fin along its length that are used in forming a SRAM cell.

Figure 6:
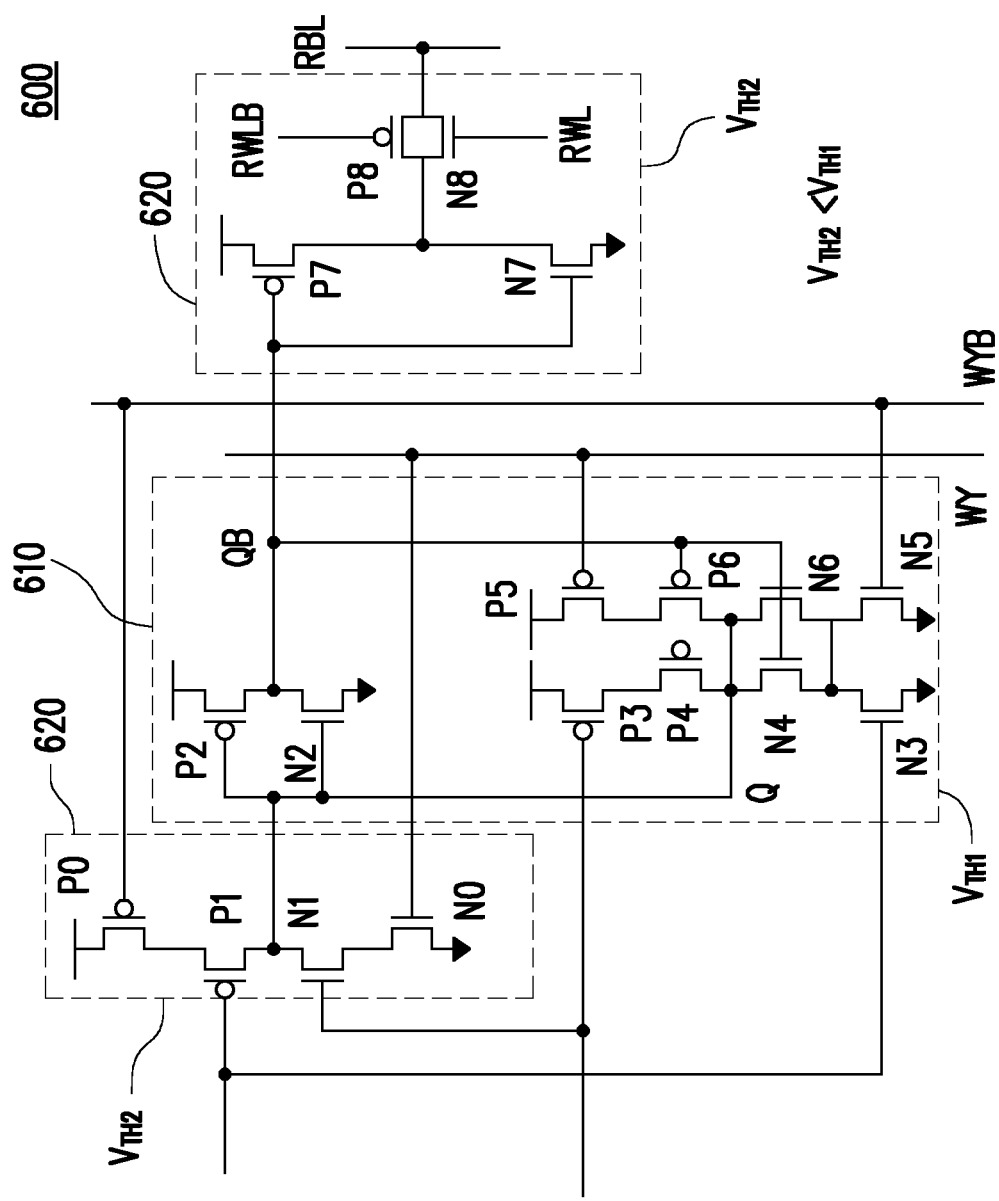
FIG. 6 shows a schematic diagram of another SRAM cell according to some embodiment.

One advantage of the structure shown in FIG. 5, with the dummy transistors and increased physical separation between groups of transistors along a common fin, is that transistors of different characteristics, such as threshold voltages (VTH), can be fabricated. A higher VTH leads to a lower leakage current, at the expense of a lower switching speed. Thus, in some situations, it is advantageous to have a high VTH for the transistor that serve the function of maintaining data in the cell and a lower VTH for the transistor that serve the function of enabling and disabling data I/O. Thus, for example, in the embodiment shown in FIG. 6, the circuit of the memory cell (600) is otherwise identical to that of the memory cell (300) shown in FIG. 3, except that the transistors within each cell have two different VTH. The first group (610) includes transistors, P2-P6 and N2-N6, which serve to store data and has a first threshold voltage, VTH1; the second group (620) includes transistors, P0, P1, P7, P8, N0, N1, N7 and N8, which serve to enable and disable data I/O, has a second threshold voltage, VTH2<VTH1.

Figure 7:
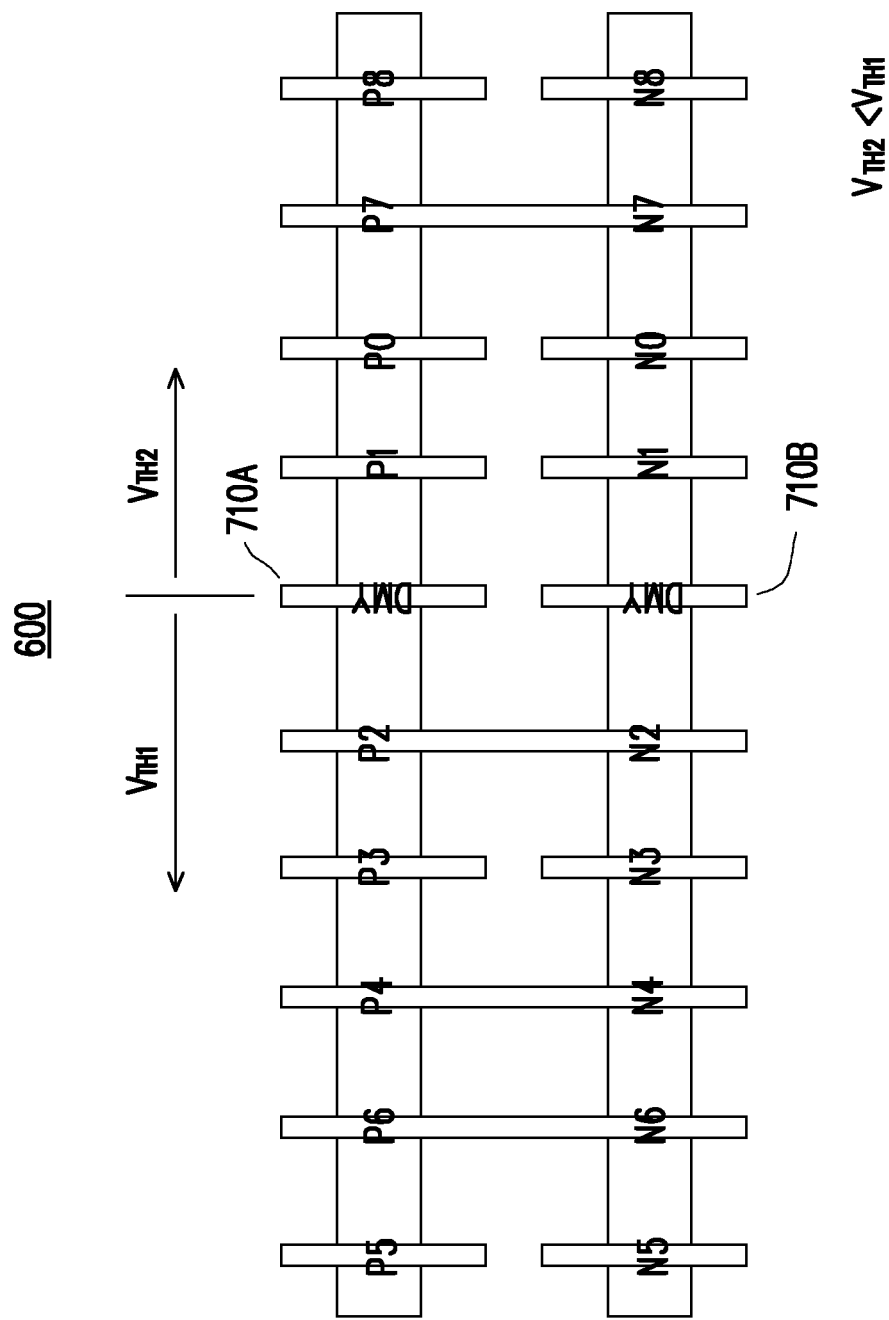
FIG. 7 shows a schematic physical layout of the SRAM cell of FIG. 4 according to some embodiments.

In physical layout, as shown in FIG. 7, the two groups of transistors in the memory cell structure (700) are separated by a greater distance than the inter-transistor spacing within each group and by dummy transistors 710A and 710B.

In some embodiments, the memory cells, such as those (200, 300) shown above, can be arranged physically with a memory array to facilitate better performance. For example, in the embodiments shown in FIG. 8, memory cells within a cell array (800) can be arranged such that successively addressed cells are arranged in alternating (or cyclic) rows, and I/O-enabling lines, such as WX (and WXB) and RWL lines are interleaved. For example, in the embodiment shown in FIG. 8, memory cells 0 through 7 are arranged in two rows, i.e., an even-numbered row (860) having cells 0, 2, 4 and 6, and an odd-numbered row (870) having cells 1, 3, 5 and 7. The WX lines (including WXB lines) and RWL lines for the cells are arranged in the order the cells are addressed. Thus, for example, Cell-0 (810), Cell-1 (820), Cell-2 (830) and Cell-3 (840) are alternately located in the even row (860) and odd row (870), with the respective write word lines WX[0], WX[1], WX[2] and WX[3] (and corresponding WXB's) arranged in consecutive order; the respective read word lines RWL[0], RWL[1], RWL[2] and RWL[3] are also arranged in consecutive order. Cell-0 through -7 in this example share an RBL line. In some embodiments, pairs of memory cells are laid out in mirror images of each other across the shared RBL. For example, Cell-0 (810) can have a physical layout shown in FIG. 8, with transistor P8 and N8 at the right-most end; Cell-2 (830) can have otherwise the same physical layout as Cell-0 except that the layout is a mirror image of that shown in FIG. 8 about the boundary (850) between Cell-0 and Cell-2, with transistor P8 and N8 at the left-most end and the shared connection to the RBL line at the boundary (850) between the two cells (830, 810).

Figure 8:
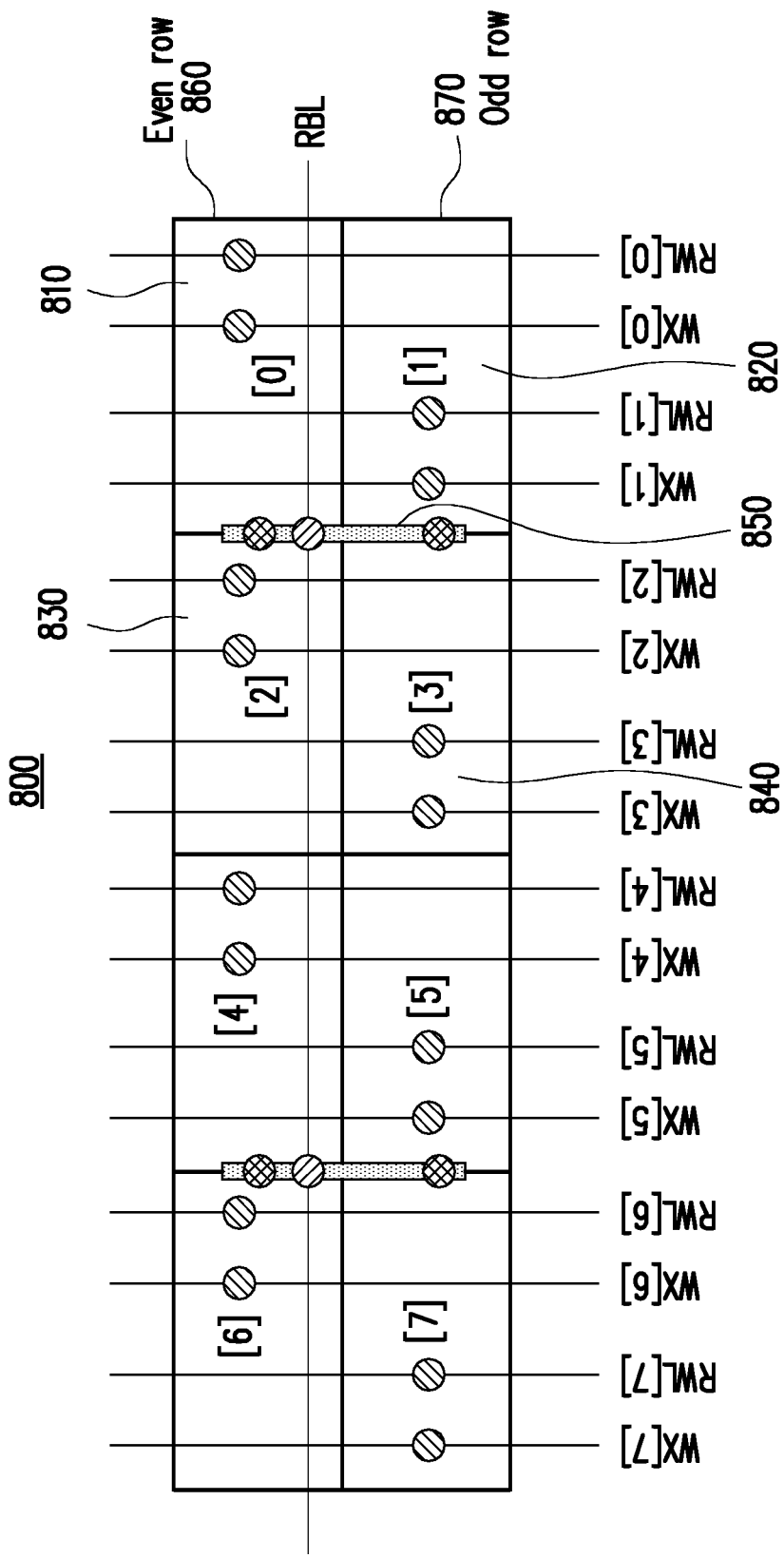
FIG. 8 shows schematically a portion of a memory cell array with interleaved word lines according to some embodiments.

Compared to a cell arrangement in which the successively addressed cells (e.g., Cells-0 through -7) are physically arranged along a single line, the RBL in the interleaved layout in FIG. 8 is half the length. The RBL routing loading is thus reduced, resulting in faster operation and reduced power consumption.

Figure 9:
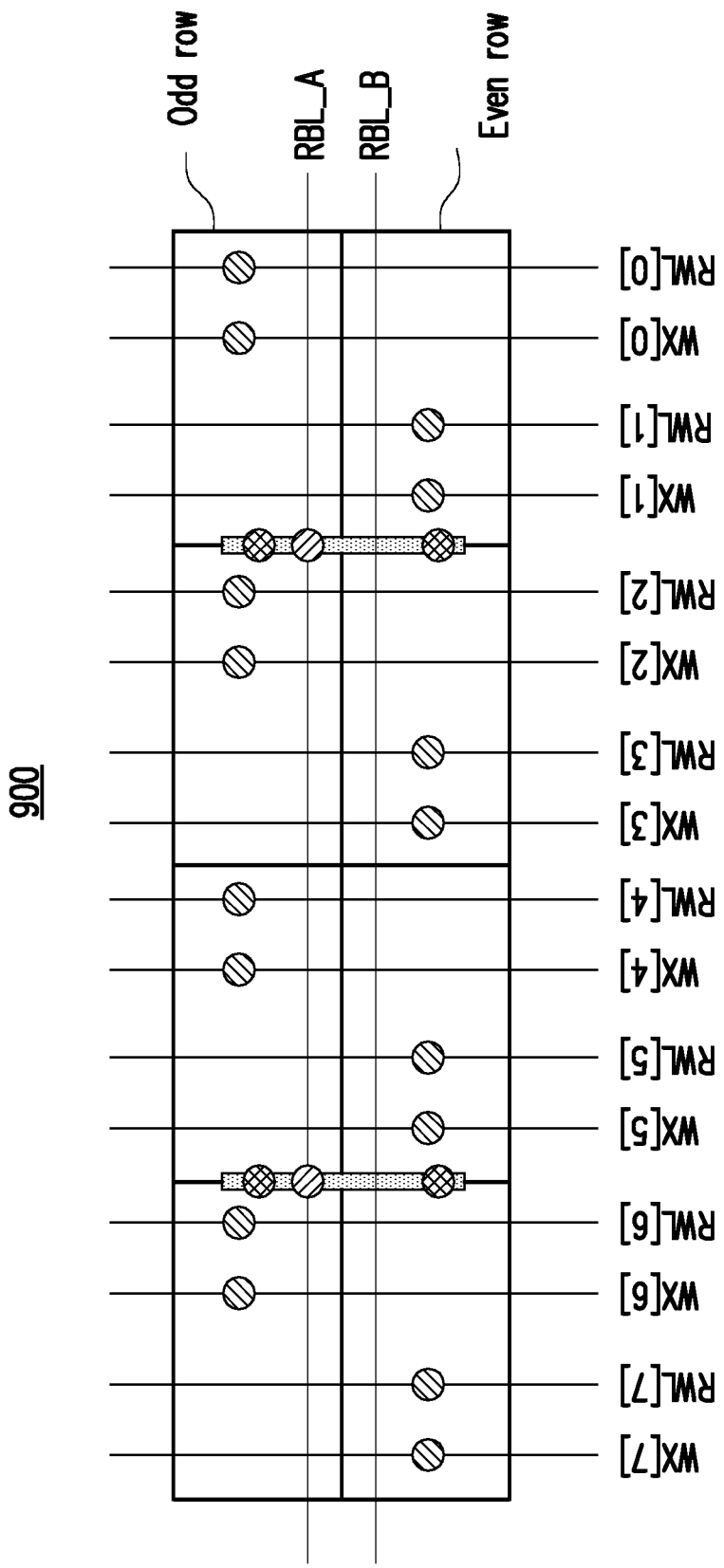
FIG. 9 shows schematically a portion of a memory cell array with interleaved word lines and interleaved bit lines according to some embodiments.

Further improvements in SRAM performance can be achieved by additional interleaving of I/O-access lines. For example, in some embodiments, as shown in FIG. 9, instead of single RBL as in FIG. 8, two RBL's can be used in an interleaved manner. In this example, a first RBL, RBL-A, connects to the RBL's Cells-0 through -3; a second RBL, RBL-B, connects to the RBL's Cells-4 through -7, etc. The reduced loading of the RBL's further improves speed.

Figure 10:
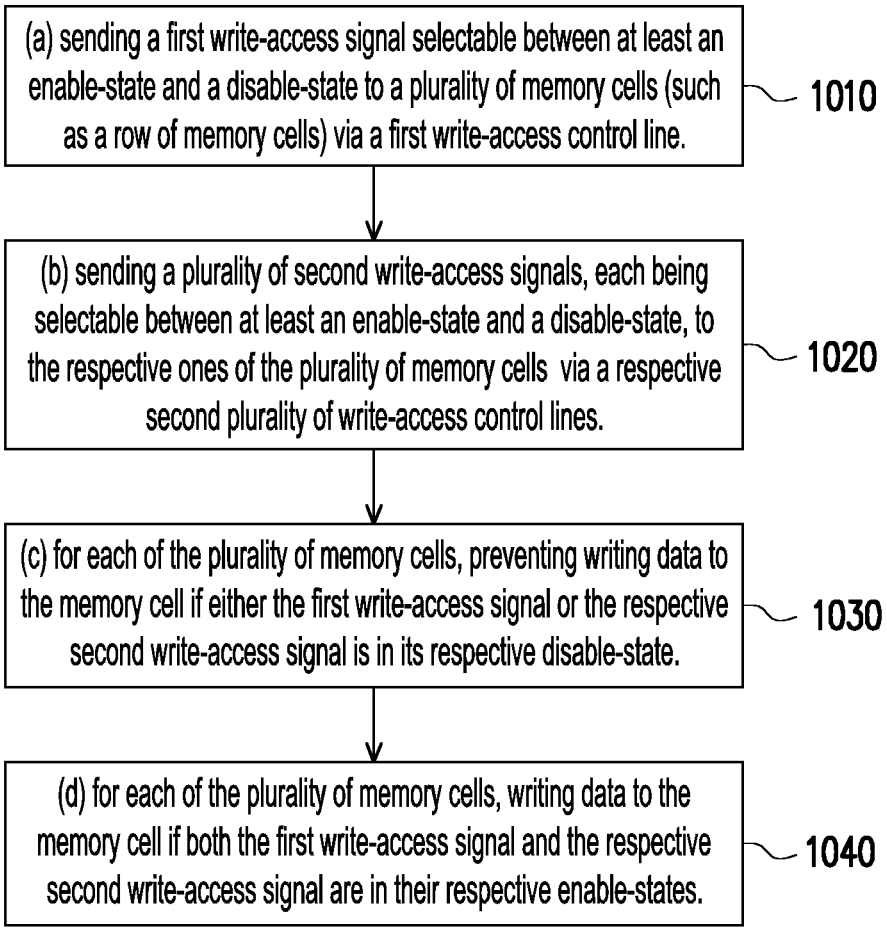
FIG. 10 outline a process of writing to a memory cell according to some embodiments.

Certain examples of SRAM cells and SRAM cell arrays described in the present disclosure facilitate improved performance of SRAM devices. In some embodiments, the improved performance is provided at least in part by providing bit-writing-mask capability to SRAM cells. Thus, in some embodiments, as outlined in FIG. 10, with additional references to the exemplary memory cells and access lines shown in FIG. 1 and to Table 1, a method (1000) of writing data to an SRAM device (100) includes: (a) sending a first write-access signal selectable between at least an enable-state and a disable-state to a plurality of memory cells (such as a row of memory cells (200)) via a first write-access control line ($WX_1$, ..., or $WX_m$) (1010), (b) sending a plurality of second write-access signals, each being selectable between at least an enable-state and a disable-state, to the respective ones of the plurality of memory cells (200) via a respective second plurality of write-access control lines ($WY_1$, ..., or $WY_n$) (1020), (c) for each of the plurality of memory cells (200), preventing writing data to the memory cell if either the first write-access signal or the respective second write-access signal is in its respective disable-state (Table 1) (1030), and (d) for each of the plurality of memory cells, writing data to the memory cell if both the first write-access signal and the respective second write-access signal are in their respective enable-states (Table 1) (1040).

In accordance with some disclosed embodiments, a memory cell includes a data storage having an input and an output, and is adapted to maintain at the output an output signal in a state corresponding to a state of an input signal at the input. An access control is adapted to input data to, and output data from, the data storage. The access control includes a read-access control adapted to receive from a read-access control line a read-access control signal selectable between at least one read-enable state and at least one read-disable state, and to output to a read-signal line a signal corresponding to the output signal at the output of the data storage when the read-access control signal is in the read-enable state. A first write-access control is adapted to receive from a first write-access control line a first write-access control signal selectable between at least one write-enable state and at least one write-disable state. A second write-access control is adapted to receive from a second write-access control line a second write-access control signal selectable between at least one write-enable state and at least one write-disable state. The first and second write-access controls are cooperatively adapted to permit a data signal from a write-signal line to be written to the input of the data storage only when both of the first and second write-access control signals are in their respective write-enable states.

In accordance with further embodiments, an SRAM device includes a plurality of SRAM cells arranged in a plurality of rows and a plurality of columns. A plurality of first write-access control lines are each adapted to transmit to the memory cells in each row a first write-access control signal selectable between at least an enable-state and disable-state. A plurality of second write-access control lines are each adapted to transmit to the memory cells in each column a second write-access control signal selectable between at least an enable-state and disable-state. A plurality of read-access control lines are each adapted to transmit to the memory cells in each row a read-access control signal selectable between at least an enable-state and disable-state. Each of the plurality of memory cells in the SRAM device include data storage and a write-access control adapted to receive the first write-access control signal and the second write-access control signal, and to permit data to be written to the data storage only when the received first and second write-access signals are in their respective enable-states.

In accordance with other embodiments, a method of writing data to an SRAM device includes sending a first write-access signal selectable between at least an enable-state and a disable-state to a plurality of SRAM cells via a first write-access control line. A plurality of second write-access signals that are each selectable between at least an enable-state and a disable-state are sent to the respective ones of the plurality of memory cells via a respective second plurality of write-access control lines. For each of the plurality of memory cells, writing data to the memory cell is prevented if either the first write-access signal or the respective second write-access signal is in its respective disable-state. For each of the plurality of memory cells, data are written to the memory cell if both the first write-access signal and the respective second write-access signal are in their respective enable-states.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A memory cell, comprising:
   a data storage having an input and an output, and adapted to maintain at the output an output signal in a state corresponding to a state of an input signal at the input; and
   an access control adapted to input data to, and output data from, the data storage, the access control comprising:
   a read-access control adapted to receive from a read-access control line a read-access control signal selectable between at least one read-enable state and at least one read-disable state, and to output to a read-signal line a signal corresponding to the output signal at the output of the data storage when the read-access control signal is in the read-enable state;
   a first write-access control adapted to receive from a first write-access control line a first write-access control signal selectable between at least one write-enable state and at least one write-disable state; and
a second write-access control adapted to receive from a second write-access control line a second write-access control signal selectable between at least one write-enable state and at least one write-disable state,
the first and second write-access controls being cooperatively adapted to permit a data signal from a write-signal line to be written to the input of the data storage only when both of the first and second write-access control signals are in their respective write-enable states.

2. The memory cell of claim 1, wherein:
the data storage comprises a pair of inverters, each of which has an input and an output, the input of each of the inverters being connected to the output of the other one of the inverters, the input of the data storage being the input of one of the inverters, and the output of the data storage being the input of the other one of the inverters;
the first write-access control comprises a first plurality of switching transistors; and
the second write-access control comprises a second plurality of switching transistors,
the read-access control comprises a third plurality of switching transistors,
wherein at least one of the first plurality of switching transistors and at least one of the second plurality of switching transistors are configured to connect the input of the data storage to a voltage supply only when both of the at least one of the first plurality of switching transistors and the at least one of the second plurality of switching transistors are conducting.

3. The memory cell of claim 2, wherein
each of the pair of inverters comprises a p-type metal-oxide-semiconductor (PMOS) transistor and an n-type metal-oxide-semiconductor (NMOS) transistor connected in series with each other at a junction, the junction between the PMOS and NMOS transistors in one of the pair of inverters being the output of the data storage, and the junction between the PMOS and NMOS transistors in the other one of the pair of inverters being the input of the data storage, and
each of the first, second and third pluralities of switching transistors are PMOS or NMOS transistors.

4. The memory cell of claim 3, wherein the transistors in the pair of inverters have a first threshold voltage, and the at least one of the first plurality of switching transistors and the at least one of the second plurality of switching transistors have a second threshold voltage, the second threshold voltage being lower than the first threshold voltage.

5. The memory cell of claim 1, wherein:
the first write-access control comprises a first pair of write-access inputs adapted to receive from a first respective pair of write-access control lines a first respective pair of write-access control signals,
the second write-access control comprises a second pair of write-access inputs adapted to receive from a second respective pair of write-access control lines a second respective pair of write-access control signals,
the memory cell further comprising a first and second power inputs, the second power input adapted to be at a higher voltage than the first power input.

6. The memory cell of claim 5, wherein:
the data storage comprises a first and second inverters, each of which has an input and an output, the input of each of the first and second inverters being connected to the output of the other one of the inverters, the input of the data storage being the input of the first inverter, and the output of the data storage being the input of the second inverter;
the first write-access control further comprises a first plurality of switching transistors, each having a gate, a source and a drain, the first plurality of transistors comprising:
a first NMOS transistor with its gate connected to a first one of the first pair of write-access inputs;
a first PMOS transistor with its gate connected to a second one of the first pair of write-access inputs;
a second PMOS transistor with its gate connected to the first one of the first pair of write-access inputs;
a second NMOS transistor with its gate connected to the second one of the first pair of write-access inputs;
the drain of the first PMOS transistor and the source of the first NMOS transistor being connected to the input of the data storage;
the second write-access control further comprises a second plurality of switching transistors, each having a gate, a source and a drain, the second plurality of switching transistors comprising:
a third NMOS transistor with its gate connected to a first one of the second pair of write-access inputs, its source connected to the drain of the first NMOS transistor, and its drain connected to the first power input;
a third PMOS transistor with its gate connected to a second one of the second pair of write-access inputs, its source connected to the second power input, and its drain connected to the source of the first PMOS transistor;
a fourth PMOS transistor with its gate connected to the first one of the second pair of write-access inputs, its source connected to the second power input, and its drain connected to the drain of the second PMOS transistor;
a fourth NMOS transistor with its gate connected to the second one of the second pair of write-access inputs, its source connected to the source of the second NMOS transistor, and its drain connected to the first power input.

7. The memory cell of claim 6, wherein:
the first inverter comprises:
a fifth PMOS transistor and a fifth NMOS transistor, each having a gate, a source and a drain, wherein:
the gates of the fifth PMOS transistor and fifth NMOS transistor are connected to the drain of the first PMOS transistor;
the source of the fifth PMOS transistor is connected to the second power input;
the drain of the fifth PMOS transistor is connected to the source of the fifth NMOS transistor and forms the output of the first inverter; and
the drain of the fifth NMOS transistor is connected to the first power input;
the second inverter comprises:
a sixth PMOS transistor and a sixth NMOS transistor, each having a gate, a source and a drain, wherein:
the gates of the sixth PMOS transistor and sixth NMOS transistor are connected to the drain of the fifth PMOS transistor;
the source of the sixth PMOS transistor is connected to the drain of the second PMOS transistor;
the drain of the sixth PMOS transistor is connected to the source of the sixth NMOS transistor and the gate of the second PMOS transistor, and forms the output of the second inverter; and the drain of the sixth NMOS transistor is connected to the source of the second NMOS transistor.

8. The memory cell of claim 7, further comprising:
a seventh PMOS transistor and a seventh NMOS transistor, each having a gate, a source and a drain, wherein:
the gate, source and drain of the seventh PMOS transistor is connected to the gate, source and drain, respectively, of the sixth PMOS transistor; and
the gate, source and drain of the seventh NMOS transistor is connected to the gate, source and drain, respectively, of the sixth NMOS transistor.

9. The memory cell of claim 7, further comprising a third inverter comprising:
a seventh PMOS transistor and a seventh NMOS transistor, each having a gate, source and drain, wherein:
the gates of the seventh PMOS transistor and seventh NMOS transistor are connected to the output of the data storage;
the source of the seventh PMOS transistor is connected to the second power input;
the drain of the seventh PMOS transistor is connected to the source of the seventh NMOS transistor; and
the drain of the seventh NMOS transistor is connected to the first power input;
wherein the read-access control comprises:
a pair of read-access inputs adapted to receive from a respective pair of read-access control lines a respective pair of write-access control signals;
an output connected to the read-signal line; and
a eighth NMOS transistor and an eighth PMOS transistor, each having a gate, source and drain, wherein:
the gates of the eighth NMOS transistor and eighth PMOS transistor are connected to first and second ones, respectively, of the pair of read-access inputs;
the sources of the eighth NMOS transistor and eighth PMOS transistor are connected to the drain of the seventh PMOS transistor; and
the drains of the eighth NMOS transistor and eighth PMOS transistor are connected to the output of the read-access control.

10. The memory cell of claim 8, further comprising a third inverter comprising:
an eighth PMOS transistor and an eighth NMOS transistor, each having a gate, source and drain, wherein:
the gates of the eighth PMOS transistor and eighth NMOS transistor are connected to the output of the data storage;
the source of the eighth PMOS transistor is connected to the second power input;
the drain of the eighth PMOS transistor is connected to the source of the eighth NMOS transistor; and
the drain of the eighth NMOS transistor is connected to the first power input;
wherein the read-access control comprises:
a pair of read-access inputs adapted to receive from a respective pair of read-access control lines a respective pair of write-access control signals;
an output connected to the read-signal line; and
a ninth NMOS transistor and an ninth PMOS transistor, each having a gate, source and drain, wherein:
the gates of the ninth NMOS transistor and ninth PMOS transistor are connected to first and second ones, respectively, of the pair of read-access inputs;

the sources of the ninth NMOS transistor and ninth PMOS transistor are connected to the drain of the eighth PMOS transistor; and
the drains of the ninth NMOS transistor and ninth PMOS transistor are connected to the output of the read-access control.

11. The memory cell of claim 9, wherein at least one of the second, fourth, fifth and sixth NMOS transistors and second, fourth, fifth and sixth PMOS transistors has a first threshold voltage, and at least one of the first, third seventh and eighth NMOS transistors and the first, third seventh and eighth PMOS transistors have a second threshold voltage, the second threshold voltage being lower than the first threshold voltage.

12. The memory cell of claim 10, wherein at least one of the second, fourth, fifth, sixth and seventh NMOS transistors and second, fourth, fifth, sixth and seventh PMOS transistors has a first threshold voltage, and at least one of the first, third eighth and ninth NMOS transistors and the first, third eighth and ninth PMOS transistors have a second threshold voltage, the second threshold voltage being lower than the first threshold voltage.

13. The memory cell of claim 3, where in each of the NMOS and PMOS transistors is a fin field effect transistor (FinFET), wherein the NMOS transistors share and are disposed along a first common fin, and the PMOS transistors share and disposed along a second common fin.

14. The memory cell of claim 12, wherein:
each of the NMOS and PMOS transistors is a fin field effect transistor (FinFET), wherein the NMOS transistors share and are disposed along a first common fin, and the PMOS transistors share and disposed along a second common fin positioned parallel and adjacent to the first common fin,
the second, fourth, fifth, sixth and seventh NMOS transistors and the second, fourth, fifth, sixth and seventh PMOS transistors have the first threshold voltage, and the first, third eighth and ninth NMOS transistors and the first, third eighth and ninth PMOS transistors have the second threshold voltage,
the NMOS transistors having the first threshold voltage are evenly spaced along the first common fin with a first interval, and the NMOS transistors having the second threshold voltage are evenly spaced along the first common fin with the first interval, and the NMOS transistors having the first threshold voltage and the NMOS transistors having the second threshold voltage are spaced apart by a second interval greater than the first interval, and
the PMOS transistors having the first threshold voltage are evenly spaced along the second common fin with a first interval, and the PMOS transistors having the second threshold voltage are evenly spaced along the second common fin with the first interval, and the PMOS transistors having the first threshold voltage and the PMOS transistors having the second threshold voltage are spaced apart by a second interval greater than the first interval.

15. The memory cell of claim 14, further comprising:
a first dummy transistor disposed along the first common fin and between the NMOS transistors having the first threshold voltage and the NMOS transistors having the second threshold voltage; and
a second dummy transistor disposed along the second common fin and between the PMOS transistors having the first threshold voltage and the PMOS transistors having the second threshold voltage.

16. A memory array comprising a plurality of memory cells of claim 1,
the plurality of memory cells being arranged in an array of a plurality of rows and a plurality of columns, wherein
the first write-access control lines for the respective plurality of memory cells are arranged in a linear array extending in a first direction,
the first write-access controls for the respective plurality of memory cells are adapted to receive the respective first write-access control signals in successive order along the first direction, and
the plurality of memory cells are ordered in alternating rows and in the first direction.

17. The memory array of claim 16, wherein:
the read-access control lines for the respective plurality of memory cells are arranged in a linear array extending in a second direction perpendicular to the first direction,
the read-access controls for the respective plurality of memory cells are adapted to receive the respective read-access control signals in successive order along the second direction, and
the plurality of memory cells are ordered in alternating columns and in the second direction.

18. A static random-access memory (SRAM) device comprising:
a data storage comprising a first and second complementary metal-oxide-semiconductor (CMOS) inverters, each of which having a high-voltage supply end, a low-voltage supply end, an input, and an output, the input of each of the CMOS inverters being connected to the output of the other one of the CMOS inverters, the input of the first CMOS inverter being an input of the data storage, and the input of the second CMOS inverter being an output of the data storage;
a read-access control comprising a first switching transistor adapted to receive from a read-access control line a read-access control signal selectable between at least one read-enable state and at least one read-disable state, and to output to a read-signal line a signal corresponding to the output signal at the output of the data storage when the read-access control signal is in the read-enable state;
a first write-access control comprising a second switching transistor adapted to receive from a first write-access control line a first write-access control signal selectable between at least one write-enable state and at least one write-disable state; and
a second write-access control comprising a third switching transistor adapted to receive from a second write-access control line a second write-access control signal selectable between at least one write-enable state and at least one write-disable state,
the second and third switching transistors forming a serial combination with each other, with one end of the serial combination operatively connected between a voltage supply the input of the data storage.

19. The SRAM device of claim 18, wherein the first write-access control further comprises a fourth switching transistor, and the second write-access control further comprises a fifth switching transistor, wherein the fourth and fifth switching transistors are connected in parallel with each other and connected to the high-voltage supply end of the second CMOS inverter.

20. A method of writing data to an SRAM device, the method comprising:
applying a first write-access signal to a gate of a first switching transistor in a first serial combination of a plurality of switching transistors connecting a first power supply and an input of a data storage, the storage comprising:
a first and second complementary metal-oxide-semiconductor (CMOS) inverters, each of which having a high-voltage supply end, a low-voltage supply end, an input, and an output, the input of each of the CMOS inverters being connected to the output of the other one of the CMOS inverters, the input of the first CMOS inverter being the input of the data storage, and the input of the second CMOS inverter being an output of the data storage;
applying a plurality of second write-access signals to a gate of a second switching transistor in the first serial combination;
applying a third write-access signal to a gate of a third switching transistor in a second serial combination of a plurality of switching transistors connecting a second power supply and the input of the data storage; and
applying a fourth write-access signal to a gate of a second switching transistor in the second serial combination.

* * * * *

UNITED STATES PATENT AND TRADEMARK OFFICE
CERTIFICATE OF CORRECTION

Page 1 of 2

PATENT NO. : 11,183,234 B2
APPLICATION NO. : 16/693677
DATED : November 23, 2021
INVENTOR(S) : Fujiwara et al.

It is certified that error appears in the above-identified patent and that said Letters Patent is hereby corrected as shown below:

On the Title Page

Item (56), in Column 2, under "Other Publications", Line 4, delete "Circuitd" and insert -- Circuits --, therefor.

In the Specification

In Column 3, Line 53, delete "NO," and insert -- N0, --, therefor.

In Column 3, Line 54, delete "NO" and insert -- N0 --, therefor.

In Column 3, Line 59, delete "NO" and insert -- N0 --, therefor.

In Column 4, Line 10, delete "N7)." and insert -- N7. --, therefor.

In Column 4, Line 26, delete "NO" and insert -- N0 --, therefor.

In Column 4, Line 41, delete "NO," and insert -- N0, --, therefor.

In Column 5, Line 7, delete "NO-" and insert -- N0- --, therefor.

In Column 5, Line 31, delete "(460))" and insert -- (460) --, therefor.

In Column 5, Line 49, delete "NO-" and insert -- N0- --, therefor.

In Column 5, Line 53, delete "NO-" and insert -- N0- --, therefor.

In Column 5, Line 56, delete "NO-" and insert -- N0- --, therefor.

In Column 6, Line 35, delete "NO," and insert -- N0, --, therefor.

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 11,183,234 B2

In the Claims

In Column 12, Line 10, in Claim 11, delete "third" and insert -- third, --, therefor.

In Column 12, Line 11, in Claim 11, delete "third" and insert -- third, --, therefor.

In Column 12, Line 18, in Claim 12, delete "third" and insert -- third, --, therefor.

In Column 12, Line 19, in Claim 12, delete "third" and insert -- third, --, therefor.

In Column 12, Line 23, in Claim 13, delete "where in" and insert -- wherein --, therefor.

In Column 12, Line 38, in Claim 14, delete "third" and insert -- third, --, therefor.

In Column 12, Line 39, in Claim 14, delete "third" and insert -- third, --, therefor.

In Column 14, Line 37, in Claim 20, before "second" delete "plurality of".

In Column 14, Line 37, in Claim 20, delete "signals" and insert -- signal --, therefor.